United States Patent
Birau et al.

(10) Patent No.: US 9,024,298 B2
(45) Date of Patent: May 5, 2015

(54) ENCAPSULATION LAYER FOR ELECTRONIC DEVICES

(75) Inventors: Mihaela Maria Birau, Mississauga (CA); Yiliang Wu, Mississauga (CA); Beng S Ong, Mississauga (CA)

(73) Assignee: Xerox Corporation, Norwalk, CT (US)

(*) Notice: Subject to any disclaimer, the term of this patent is extended or adjusted under 35 U.S.C. 154(b) by 1109 days.

(21) Appl. No.: 11/189,259

(22) Filed: Jul. 26, 2005

(65) Prior Publication Data

US 2007/0023746 A1    Feb. 1, 2007

(51) Int. Cl.
  *H01L 51/30*    (2006.01)
  *H01L 51/10*    (2006.01)
  *H01L 51/52*    (2006.01)
  *H01L 51/05*    (2006.01)

(52) U.S. Cl.
  CPC .......... *H01L 51/107* (2013.01); *H01L 51/0529* (2013.01); *H01L 51/0545* (2013.01); *H01L 51/10* (2013.01); *H01L 51/5237* (2013.01)

(58) Field of Classification Search
  USPC ............... 257/40, E51.001–E51.052; 438/99; 313/512
  See application file for complete search history.

(56) References Cited

U.S. PATENT DOCUMENTS

| | | | | |
|---|---|---|---|---|
| 4,131,909 A * | 12/1978 | Matsuda et al. | ............... | 257/347 |
| 4,197,141 A * | 4/1980 | Bozler et al. | .................. | 136/258 |
| 5,631,753 A * | 5/1997 | Hamaguchi et al. | .......... | 349/110 |
| 5,660,738 A * | 8/1997 | Hunter et al. | .................... | 216/17 |
| 5,719,447 A * | 2/1998 | Gardner | ........................ | 257/762 |
| 5,994,205 A * | 11/1999 | Yamamoto et al. | ........... | 438/464 |
| 6,621,099 B2 | 9/2003 | Ong et al. | | |
| 6,674,635 B1 * | 1/2004 | Fife et al. | ....................... | 361/523 |
| 6,770,904 B2 | 8/2004 | Ong et al. | | |
| 6,872,801 B2 | 3/2005 | Ong et al. | | |
| 7,554,121 B2 * | 6/2009 | Hirakata et al. | ................. | 257/79 |
| 2002/0063677 A1 * | 5/2002 | Drzaic | ........................... | 345/107 |
| 2002/0155729 A1 * | 10/2002 | Baldwin et al. | ............... | 438/780 |
| 2002/0176046 A1 * | 11/2002 | Kitamura et al. | .............. | 349/153 |
| 2003/0044552 A1 * | 3/2003 | Komada | ........................ | 428/35.7 |
| 2003/0221763 A1 * | 12/2003 | Tateishi et al. | ................... | 156/67 |
| 2003/0230967 A1 * | 12/2003 | Kawamura et al. | ........... | 313/483 |
| 2004/0029310 A1 * | 2/2004 | Bernds et al. | ..................... | 438/99 |
| 2004/0101667 A1 * | 5/2004 | O'Loughlin et al. | .......... | 428/209 |
| 2004/0195960 A1 * | 10/2004 | Czeremuszkin et al. | ...... | 313/504 |
| 2004/0239241 A1 * | 12/2004 | Wittmann et al. | ............. | 313/511 |
| 2005/0019555 A1 * | 1/2005 | Yano et al. | ..................... | 428/328 |
| 2005/0110008 A1 * | 5/2005 | Koo et al. | ........................ | 257/40 |
| 2005/0212419 A1 * | 9/2005 | Vazan et al. | ................... | 313/512 |
| 2005/0238871 A1 * | 10/2005 | Robinson et al. | .............. | 428/331 |
| 2005/0270628 A1 * | 12/2005 | Miyazaki et al. | .............. | 359/296 |

(Continued)

FOREIGN PATENT DOCUMENTS

WO    WO 2004032257 A2 *    4/2004
WO    WO 2004088767 A1 *    10/2004

OTHER PUBLICATIONS

Haganmaier, R.D. and Shaw, P.E. "Permeability of Shellac Coatings to Gases and Water Vapor." Journal of Agricultural and Food Chemistry, vol. 39, No. 5 (May 1991): pp. 825-829.*

*Primary Examiner* — Matthew W Such

(74) *Attorney, Agent, or Firm* — Zosan S. Soong; Fay Sharpe LLP

(57) ABSTRACT

An encapsulation, barrier, or protective layer for electronic devices is disclosed comprising a lac-based material, its synthetic form and variant, or a combination thereof, which protects electronic devices from adverse environmental effects.

5 Claims, 2 Drawing Sheets

(56) References Cited

U.S. PATENT DOCUMENTS

| | | |
|---|---|---|
| 2006/0093758 A1* | 5/2006 | Sakakura et al. ............... 428/1.6 |
| 2006/0132895 A1* | 6/2006 | Miyazaki ....................... 359/296 |
| 2006/0180805 A1* | 8/2006 | Lutz et al. ........................ 257/40 |
| 2006/0192197 A1* | 8/2006 | Koganei ........................... 257/40 |
| 2006/0214312 A1* | 9/2006 | Wu et al. ........................ 257/787 |
| 2007/0292957 A1* | 12/2007 | Chua et al. ......................... 436/5 |

* cited by examiner

US 9,024,298 B2

ENCAPSULATION LAYER FOR ELECTRONIC DEVICES

This Invention was made with United States Government support under Cooperative Agreement No. 70NANBOH3033 awarded by the National Institute of Standards and Technology (NIST). The United States Government has certain rights in the invention.

BACKGROUND

The present disclosure relates to an encapsulation, barrier or protective layer suitable for the protection of organic electronic devices. In particular, the present disclosure relates to the use of a lac-based material to form an encapsulation, barrier or protective layer for electronic devices such as, for example, thin film transistors or organic light emitting diodes. The term "encapsulation layer", "barrier layer", and "protective layer" in embodiments herein are used to imply essentially the same entity or component which insulates the electronic device from environmental constituents which may otherwise adversely affect the device's structural integrity, functional performance, or operational life time.

An encapsulation layer for thin film transistors (TFTs) is used herein to illustrate the concept of the present disclosure for the protection of organic electronic devices. It is understood that the present disclosure can be extended to other devices such as organic light emitting diodes.

Thin film transistors are important components of electronic circuits. A TFT comprises of a supporting substrate, three electrically conductive electrodes (gate, source and drain electrodes), a semiconductive layer and a dielectric layer. Various TFT configurations are possible to enable proper functioning of TFTs in various electronic applications. The semiconductor is electrically insulating when the transistor is in its switched-off state, when no bias voltage is applied to the gate electrode. When a bias voltage is applied to the gate electrode, the transistor is switched on, an electric current flows between the source and the drain electrodes through the semiconductor layer. At a given source-drain electric field, the current flowing between the source-drain electrodes can be modulated by the bias voltage applied to the gate electrode Organic electronic devices such as TFTs can be damaged by environmental elements such as light, water, and oxygen. To protect against the ingress of environmental elements, an organic electronic device is often encapsulated. The encapsulation layer may include an inorganic material or an organic polymer material. For example, inorganic material-based TFTs, such as amorphous silicon TFTs, may be passivated with a vacuum deposited inorganic oxide layer (e.g., silicon oxides). Organic electronic devices may be encapsulated with polymers such as polymethyl methacrylate, polyethylene, polyethyleneterephthalate, and the like. The encapsulation layer may also include protective materials such as antioxidants, desiccants, and mixtures of thereof. Such protective materials have a finite capacity to function for their intended purposes. Further, the encapsulation layer may be a multi-layer structure. The use of these protective materials or structures, however, may involve complex formulations and/or processing, which can lead to an increase in time and cost to produce an electronic device.

Therefore there is a need to provide an encapsulation layer for an electronic device such as a TFT to adequately protect it from environmental elements that may adversely affect the device's structural stability and electronic performance. There is also a need for an encapsulation layer that is easily processed and formed over an electronic device. The need also exists for an encapsulation layer for an electronic device that adequately protects the device from environmental elements without the need for additional components such as desiccants, antioxidants, and mixtures of thereof.

BRIEF DESCRIPTION

The present disclosure provides, in various embodiments thereof, an electronic device comprising an active region and an encapsulation layer, the encapsulation layer comprising a lac based material selected from the group consisting of seedlac, shellac, button lac, garnet lac, bleached lac, dewaxed and decolorized lac, their derivatives and combinations thereof.

The present disclosure also provides, in various embodiments thereof, a thin film electronic device comprising a substrate, an active region, and an encapsulation layer consisting essentially of a material selected from the group consisting of seedlac, shellac, button lac, garnet lac, bleached lac, dewaxed and decolorized lac, their derivatives and combinations thereof.

Further, the present disclosure provides, in various embodiments thereof, a method for encapsulating an electronic device comprising providing an electronic device comprising a substrate and an active region disposed on the substrate, and forming an encapsulation layer encapsulating the active region, the encapsulation layer comprising of a shellac based material selected from the group consisting of shellac, a shellac derivative, and combinations thereof.

These and other non-limiting features and characteristics are more particularly described below.

BRIEF DESCRIPTION OF THE DRAWINGS

The following figures are schematic representations of exemplary embodiments in accordance with the present disclosure. The figures are for the purpose of further illustrating various embodiments in accordance with the present disclosure and are not for the purpose of limiting the same or limiting the scope of the appended claims.

DETAILED DESCRIPTION

The present disclosure relates, in various embodiments thereof, to an encapsulation layer for an electronic device and electronic devices comprising such layers. While an encapsulation layer is described with particular reference to organic electronic devices such as organic TFTs it will be appreciated that the encapsulation layer is amenable to other electronic devices that require an encapsulation.

Figure 1:
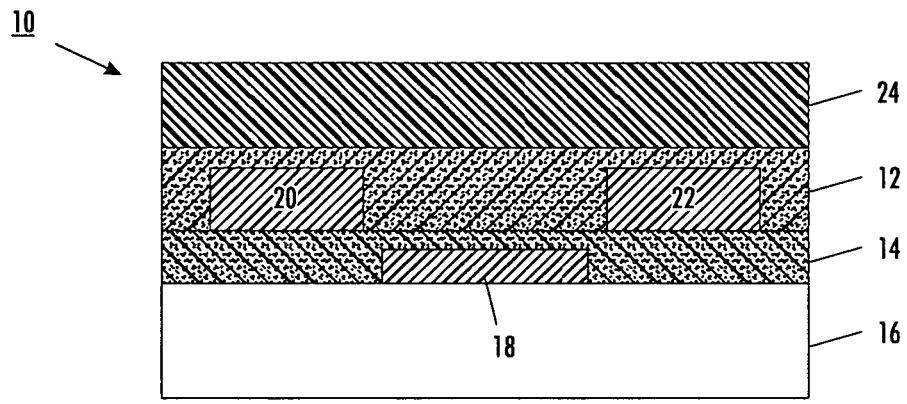
FIG. 1 is a schematic cross-sectional view of a TFT including an encapsulation layer.

In FIG. 1 there is schematically illustrated a TFT configuration 10 comprised of a substrate 16, a gate electrode 18, a gate dielectric layer 14 on top of which are deposited two metal electrodes, 20 and 22 (source and drain electrodes). Over and between the metal electrodes 20 and 22 is the semiconductor or active layer 12, and which layer can be comprised of various suitable components. The encapsulation layer 24 is deposited on and is in contact with layer 12.

Figure 2:
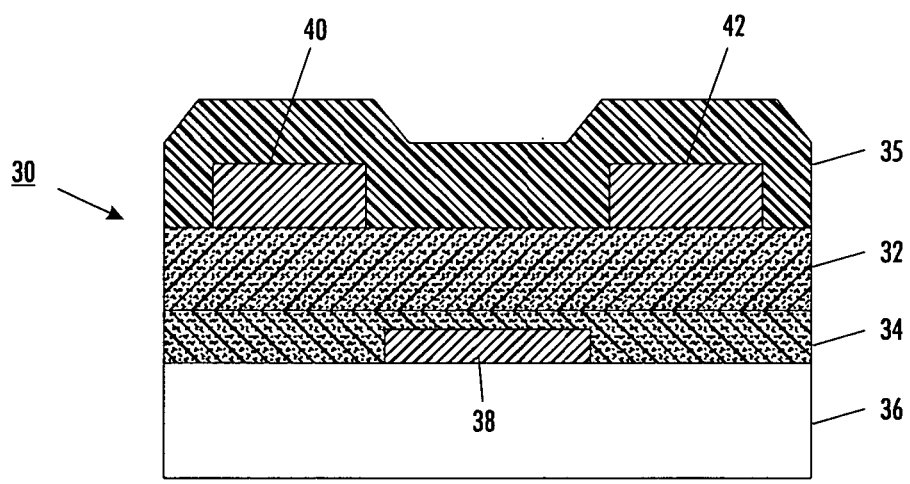
FIG. 2 is a schematic cross-sectional view of another embodiment of a TFT having an encapsulation layer.

FIG. 2 schematically illustrates another TFT configuration 30 comprised of a substrate 36, a gate electrode 38, a source electrode 40, and a drain electrode 42, a gate dielectric layer 34, an organic semiconductor layer 32, and an encapsulation layer 35.

Figure 3:
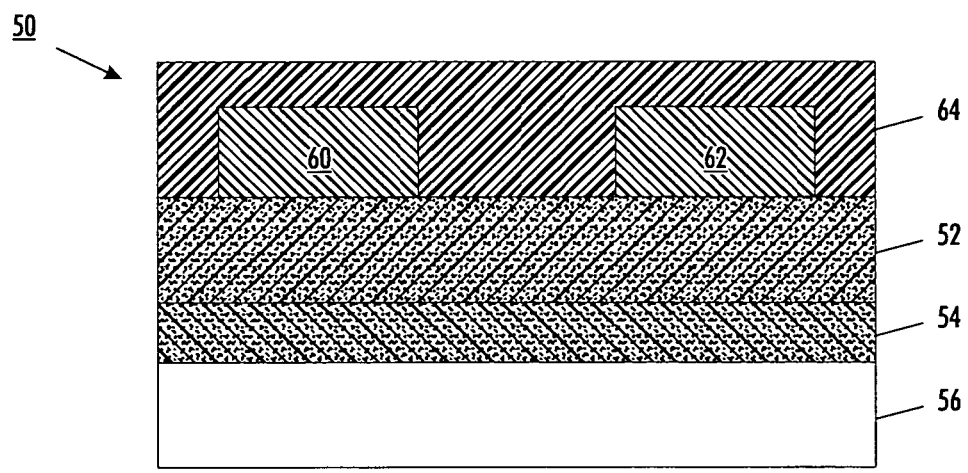
FIG. 3 is a schematic cross-sectional view of further embodiment of a TFT including an encapsulation layer; and, FIG. 4 is a schematic cross-sectional view of an additional embodiment of a TFT having an encapsulation layer.

FIG. 3 schematically illustrates a further TFT configuration 50 comprised of a heavily n-doped silicon wafer 56, which functions as both a substrate and a gate electrode, a thermally grown silicon oxide dielectric layer 54, an organic semiconductor, such as a polythiophene as illustrated herein, layer 52, on top of which are deposited a source electrode 60 and a drain electrode 62; and a encapsulation layer 64 in contact with layer 52.

Figure 4:
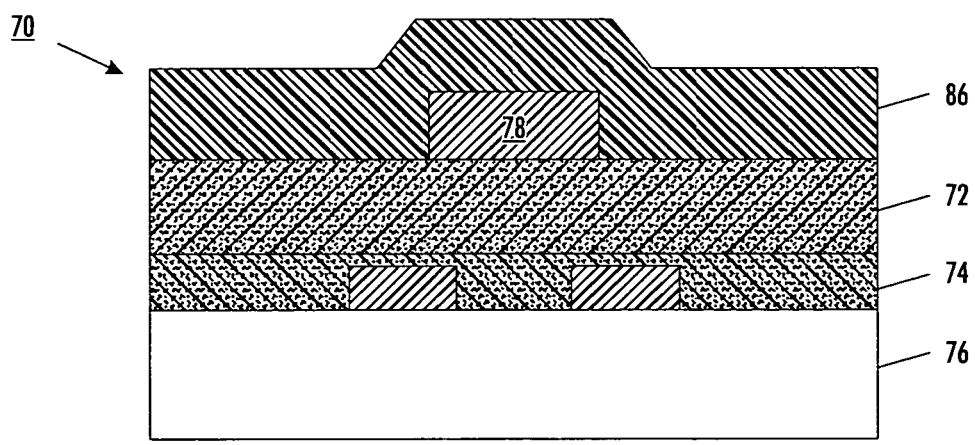

FIG. 4 schematically illustrates yet a further TFT configuration 70 comprised of substrate 76, a gate electrode 78, a source electrode 80, a drain electrode 82, an organic semiconductive layer 74, a dielectric layer 72, and wherein layer 72 is in contact with an encapsulation layer 86.

Also, other devices not disclosed, especially TFT devices, are envisioned, reference for example known TFT devices.

An electronic device in accordance with the present disclosure includes an active region and an encapsulation layer encapsulating the active region. An active region generally includes an electroactive material in contact with electrical contacts, such as, for example, electrodes. The active region may be supported by a suitable substrate. In accordance with the present disclosure, the encapsulation layer includes a lac based material. The encapsulation layer encapsulates the active region. In embodiments, the encapsulation layer may be disposed directly on the active region. In other embodiments, the encapsulation layer may be spaced apart from the active region by supports such that there is a gap between the electronic functional region and the encapsulation layer.

An encapsulation layer in accordance with the present disclosure includes a lac based material. As used herein, a "lac based material" includes seedlac, shellac, button lac, garnet lac, bleached lac, dewaxed and decolorized lac, their derivatives, their synthetic forms and variants, and combinations thereof. The definition of Lac-based materials is given in the book chapter entitled "Shellac" in "Encyclopedia of Polymer Science and Technology", by Misra G. S. and Sengupta S. C., eds. H. F. Mark and N. G. Gaylord, Interscience Publishers, New York, Vol. 12, pp 419-440 (1970), fully incorporated herein by reference. In embodiments, shellac is preferably used in the encapsulation layer of the present disclosure. Shellac is a resinous secretion of a lac insect, and is mainly comprised of esters of dihydroxyficocerylic acid. A shellac-based coating forms a suitable encapsulation layer for electronic devices. Without being bound to any particular theory, it is believed that the excellent barrier properties of shellac arise from good packing of the dihydroxyficocerylic acid due to strong hydrogen bonding.

The encapsulation layer may be formed from a composition that includes a lac based material selected from the group consisting of seedlac, shellac, button lac, garnet lac, bleached lac, dewaxed and decolorized lac, their derivatives, their synthetic forms and variants, and combinations thereof. Preferably shellac or its derivative is selected. Examples of shellac derivatives include, but are not limited to shellacs with chemically altered structure such as esters with ethylene glycol, glycerol, myristic acid, phthalic anhydride and succinic anhydride.

The composition used to form the encapsulation layer includes the lac based materials dissolved in a solvent. Examples of suitable solvents include, but are not limited to alcohols, water solutions of alkali, organic acids and ketones. Examples of suitable alcohols include methanol, ethanol, propanol, butanol, pentanol and the like. In one embodiment the solvent is ethanol. The shellac based barrier material is present in the coating solution in an amount of from about 1 to about 20 percent by weight of the solution. In one embodiment, the shellac based material is present in an amount of about 5 weight percent of the coating solution.

The shellac composition can be deposited on the electronic device using any known deposition methods in the art such as spin coating, casting, dipping, printing and the like. The encapsulation layer is then dried and may be optionally annealed at a suitable temperature such as for example above 30° C. for various lengths of time. In the embodiments the encapsulation layer was annealed at 50° C. in a vacuum oven for 30 minutes.

The encapsulation layer may optionally comprise protective additive materials as desired for a particular purpose or intended use. As used herein, a "protective additive" is a material that functions to retard or prevent the ingress of environmental reactants into an electronic device. Examples of protective additives include, but are not limited to, antioxidants, desiccants, and mixtures of thereof.

In embodiments, an encapsulation layer formed from a lac based material, however, provides adequate protection from environmental reactants without protective additives. That is, in embodiments, the encapsulation layer may comprise, consist essentially of, or consist of a lac based material. In embodiments, an encapsulation layer in accordance with the present disclosure is substantially free of any other protective additives such as, for example, antioxidants, desiccants, and mixtures of thereof.

The encapsulation layer may have a thickness of from about 10 micrometer to about 900 nanometers including from about 100 to about 900 nanometers. In other embodiments, the encapsulation layer has a thickness of from 200 to about 500 nanometers.

Lac based materials provide a suitable encapsulation layer for an electronic device. The type of electronic device is not critical. The following descriptions of electronic devices having a lac-based encapsulation layer are merely for the purpose of illustration and not limiting embodiments thereof. It will be appreciated that a lac-based encapsulation layer may be used in other types of electronic devices.

TFTs are known in the art, and any TFT configuration may be encapsulated with a layer comprising a lac-based encapsulation layer. The structural description of a TFT and suitable components is merely exemplary and not a limitation on the type of organic device or TFT with which the present encapsulation layer may be used. Generally, the substrate layer of a TFT may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers especially for a flexible plastic substrate and from about 1 to about 10 millimeters for a rigid substrate such as glass or silicon.

Dielectric

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material may have a dielectric constant of, for example, at least about 3, thus a suitable dielectric thickness of about 300 nanometers can provide a desirable capacitance, for example, of about $10^{-9}$ to about $10^{-7}$ F/cm$^2$.

Semiconductor

Situated, for example, between and in contact with the dielectric layer and the source/drain electrodes is the active semiconductor layer. Materials suitable for the organic semiconductor material include n-type semiconductor materials (where conductivity is controlled by negative charge carriers) and p-type semiconductor materials (where conductivity is controlled by positive charge carriers). A single material or mixture of two, three or more different materials can be used for the semiconductor material. N-type materials include for example perylene pigments such as N,N'dialkylperylene-3,4,9,10-tetracarboxlic diimides, naphthalene-1,4,5,8-tetracarboxylic diimides, certain metal phthalocyanines, nitrofluorenones, substituted fluorene malononitrile adducts, halogenated anthanthrones, tris(8-hydroxyquinolinato)aluminum and oligomers and polymers containing such groups. P-type materials include for example pentacene, certain metal phthalocyanines, triarylamines, carbazoles, arylhydrazones and oligomers and polymers containing such structures, as well as polythiophenes, polyphenylvinylene, and polyvinylcarbazoles. Examples of polythiophenes include, but are not limited to those described in U.S. Pat. Nos. 6,872,801; 6,770,904; and 6,621,099; and in U.S. patent application Ser. Nos. 10/392,633 and 10/922,662. The entire disclosures of these patents and applications are incorporated herein by reference in their entirety.

The thickness of the semiconductor layer is generally, for example, about 10 nanometers to about 1 micrometer, or about 40 to about 100 nanometers. This layer can generally be fabricated by solution processes such as spin coating, casting, screen, stamp, or jet printing of a solution of the semiconductor material(s).

Electrodes

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials that provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is about, for example, from about 40 nanometers to about 1 micrometer with the more specific thickness being about 100 to about 400 nanometers. A TFT device may contain a semiconductor channel with a width W and length L. The semiconductor channel width may be, for example, from about 10 micrometers to about 5 millimeters, with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +10 volts to about −80 volts is applied to the gate electrode.

Other known materials not recited herein for the various components of a TFT device that includes an encapsulation layer in accordance with the present disclosure can also be selected in embodiments.

Substrate

A substrate can be opaque or transparent. It can comprise any suitable organic or inorganic materials having the required mechanical properties. For example, it may be composed of silicon wafer, glass plate, plastic film or plastic sheet. For structurally flexible devices, a plastic substrate such as polyester, polycarbonate, polyimide sheets and the like may be preferred. The substrate may have a thickness ranging from about 10 micrometers to over 10 millimeters with an exemplary thickness ranging from about 50 to 100 micrometers for a flexible plastic substrate and from about 1 to 10 millimeters for a rigid substrate such as glass plate or silicon wafer.

The description of the various TFT embodiments are merely for the purpose of illustrating possible examples of electronic devices which may be encapsulated with an encapsulation or barrier layer in accordance with the present disclosure. It will be appreciated that other configurations and materials may be used to provide such devices.

While described with reference to specific types of electronic devices, it will be appreciated that an encapsulation layer having a lac based material may be used with other electronic devices requiring such a protective layer.

An electronic device with an encapsulation layer comprising a lac-based material is further described with reference to the following examples. The examples are merely for the purpose of illustrating an embodiment of a device comprising a lac-based encapsulation layer and are not intended to be a limiting example thereof.

EXAMPLES

Example 1

A bottom-contact TFT was produced. It comprised an n-doped silicon wafer with a thermally grown silicon oxide layer having a thickness of about 110 nanometers. The wafer functioned as the gate electrode. The silicon oxide layer functioned as the dielectric layer and had a capacitance of about 30 nanofarads per square centimeter (nF/cm2) as measured with a capacitor meter. The silicon wafer was first cleaned with isopropanol, air dried, and then immersed in a 0.1 M solution of octyltrichlorosilane in toluene for 20 minutes at 60° C. The wafer was subsequently washed with toluene and isopropanol and dried. A 30-nm thin film of PQT-12 semiconductor layer, reference the publication by B.S. Ong et al., Journal of the American Chemical Society, volume 126, pages 3378-3379 (2004), fully incorporated herein by reference, was deposited by spin coating. The wafer was further annealed at 140° C. for 10-30 min to induce molecular ordering in the semiconductor layer. Finally, a gold layer with a thickness of about 60 nm was deposited on top of the semiconductor by vacuum evaporation through a shadow mask to create pairs of source and drain electrodes with various channel length and channel width.

The encapsulation layer is composed of 100 weight percent shellac based on the weight of the barrier layer. The encapsulation solution was prepared by dissolving 0.397 grams shellac in 9.5 mL ethyl alcohol. The solution was deposited on top of the TFT by spin coating. The TFTs were dried at 60° C. under vacuum for one hour. The temperature was raised to 90° C. and the TFTs were kept at this temperature for 30 minutes. The thickness of the encapsulated layer was 255 nm. Dewaxed decolorized shellac known as shellac 101 was supplied by Renshel Exports Ltd.

The TFTs were evaluated using a Keithley 4200 Semiconductor characterization system immediately after encapsulation and over a period of 30 days after standing in air under white light. TFTs were characterized by measuring their output and transfer curves.

The device in Example 1 showed essentially no change in its current on/off ratio after 30 days of standing in air under white light.

Comparative Example 1

A comparative TFT was fabricated according to the procedure described in Example 1 except that no encapsulation layer was applied. The TFTs were let to stand in air under white light under similar conditions. After only 7 days of standing in air under white light, this comparative TFT device exhibited a drastic decrease in its current on/off ratio by as much as four orders of magnitude.

As can be seen from the above examples, the unprotected TFT essentially lost its transistor characteristics in about 7 days. The TFT with the shellac-based encapsulation layer still exhibited good characteristics after 30 days under similar conditions.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An electronic device comprising, in sequence:
a single substrate;
at least one electrode;
a semiconductor layer; and
an encapsulation layer that is an outermost layer relative to the substrate;
wherein the encapsulation layer comprises a shellac, a shellac-based material, a synthetic shellac-based material, a shellac derivative, a chemically modified shellac-based material, or combinations thereof;
wherein the at least one electrode and the semiconductor layer are closer to the substrate than the encapsulation layer;
wherein the electronic device is a thin film transistor or an organic light emitting diode; and
wherein the encapsulation layer has a thickness of from 100 nanometers to 900 nanometers.

2. The electronic device according to claim 1, wherein the encapsulation layer is substantially free of antioxidants or desiccants.

3. The electronic device according to claim 1, wherein the encapsulation layer consists essentially of a shellac-based material.

4. The electronic device according to claim 1, wherein the encapsulation layer consists essentially of a chemically modified shellac-based material.

5. A thin film transistor consisting of:
a substrate;
a drain electrode, a source electrode, and a gate electrode;
a gate dielectric layer;
a semiconductor layer; and
an encapsulation layer;
wherein the encapsulation layer consists of a shellac, a shellac-based material, a synthetic shellac-based material, a shellac derivative, a chemically modified shellac-based material, or combinations thereof;
wherein the gate dielectric layer separates the substrate and the gate electrode from the source electrode, the drain electrode, and the semiconductor layer;
wherein the source electrode and the drain electrode contact the semiconductor layer;
wherein the drain electrode, the source electrode, the gate electrode, the gate dielectric layer, and the semiconductor layer are located between the substrate and the encapsulation layer; and
wherein the encapsulation layer has a thickness of from 100 nanometers to 900 nanometers.

* * * * *